(12) United States Patent
Kitazaki et al.

(10) Patent No.: US 10,529,668 B2
(45) Date of Patent: Jan. 7, 2020

(54) METHOD OF MANUFACTURING ELECTRONIC COMPONENT MODULE

(71) Applicant: TAIYO YUDEN CO., LTD., Tokyo (JP)

(72) Inventors: Kenzo Kitazaki, Tokyo (JP); Takehiko Kai, Tokyo (JP); Masaya Shimamura, Tokyo (JP); Mikio Aoki, Tokyo (JP); Jin Mikata, Tokyo (JP); Taiji Ito, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 15/935,829

(22) Filed: Mar. 26, 2018

(65) Prior Publication Data
US 2018/0286817 A1    Oct. 4, 2018

(30) Foreign Application Priority Data

Mar. 30, 2017   (JP) .................................. 2017-067031

(51) Int. Cl.
*H01L 23/552*    (2006.01)
*H01L 23/66*    (2006.01)
(Continued)

(52) U.S. Cl.
CPC ............ *H01L 23/552* (2013.01); *H01L 21/56* (2013.01); *H01L 21/561* (2013.01); *H01L 21/78* (2013.01);
(Continued)

(58) Field of Classification Search
CPC .................................................. H01L 23/552
See application file for complete search history.

(56) References Cited

U.S. PATENT DOCUMENTS

2010/0140780 A1* 6/2010 Huang .................... H01L 24/29
                                                                257/690
2010/0172116 A1* 7/2010 Yorita ................... H01L 21/565
                                                                361/816
(Continued)

FOREIGN PATENT DOCUMENTS

JP    2009-218484 A    9/2009
JP    2014-116368 A    6/2014
(Continued)

OTHER PUBLICATIONS

Japanese Office Action dated Oct. 23, 2018, in a counterpart Japanese patent application No. 2017-067031. (A machine translation (not reviewed for accuracy) attached.)
(Continued)

*Primary Examiner* — Walter H Swanson
(74) *Attorney, Agent, or Firm* — Chen Yoshimura LLP

(57) ABSTRACT

Forming a groove in a dicing region so as to expose a conductive pattern material on a side surface, closer to a first side of each of mounting regions, of a substrate; when forming a first sealing portion enclosing a wireless region and a second sealing portion enclosing an antenna region adjacent to the wireless region on a side of a second side of each of the mounting regions, reducing a thickness in a height direction such that a thickness of the second sealing portion becomes smaller in thickness than a thickness of the first sealing portion; forming a shielding film such that a scattered matter made of a conductive material is allowed to pass through an upper surface of the second sealing portion, to be deposited onto the conductive pattern material exposed on a side surface of the substrate; and separating the substrate into the mounting regions individually.

5 Claims, 11 Drawing Sheets

(51) Int. Cl.
*H01L 21/78* (2006.01)
*H01L 21/56* (2006.01)
*H01L 23/31* (2006.01)
*H01L 23/00* (2006.01)

(52) U.S. Cl.
CPC .......... *H01L 23/3121* (2013.01); *H01L 23/66* (2013.01); *H01L 24/16* (2013.01); *H01L 24/48* (2013.01); *H01L 2223/6677* (2013.01); *H01L 2224/16227* (2013.01); *H01L 2224/48227* (2013.01); *H01L 2224/97* (2013.01); *H01L 2924/15159* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01)

(56) References Cited

U.S. PATENT DOCUMENTS

2014/0002188 A1* 1/2014 Chen .................. H03F 3/19
　　　　　　　　　　　　　　　　　　　　　330/250
2014/0035097 A1* 2/2014 Lin .................. H01L 23/552
　　　　　　　　　　　　　　　　　　　　　257/531
2014/0167232 A1* 6/2014 LoBianco .............. H01L 21/56
　　　　　　　　　　　　　　　　　　　　　257/659
2016/0149300 A1 5/2016 Ito et al.

FOREIGN PATENT DOCUMENTS

JP　　2014-146624 A　　8/2014
WO　　2015/015863 A1　　2/2015

OTHER PUBLICATIONS

Japanese Office Action dated Jun. 5, 2018, in a counterpart Japanese patent application No. 2017-067031.
Japanese Office Action (Decision of Refusal) dated Mar. 12, 2019 in a counterpart Japanese patent application No. 2017-067031. (A machine translation (not reviewed for accuracy) attached.)
Japanese Office Action (Decision to Decline the Amendment) dated Mar. 12, 2019 in a counterpart Japanese patent application No. 2017-067031. (A machine translation (not reviewed for accuracy) attached.)

* cited by examiner

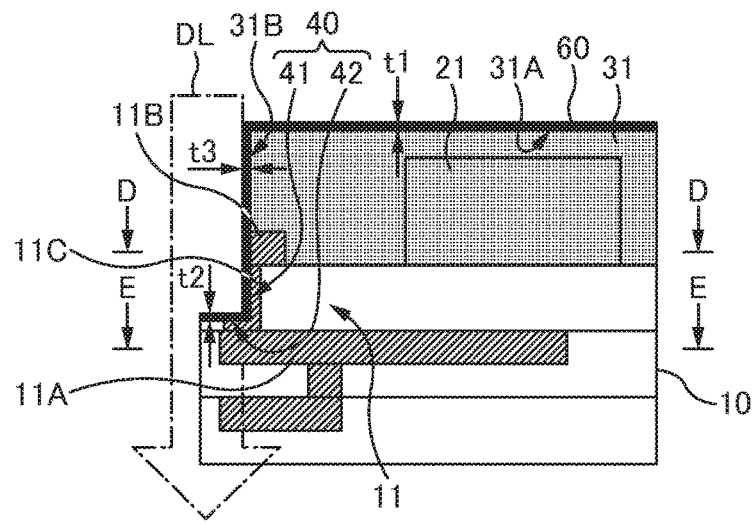
FIG. 2A ENLARGED VIEW OF REGION S
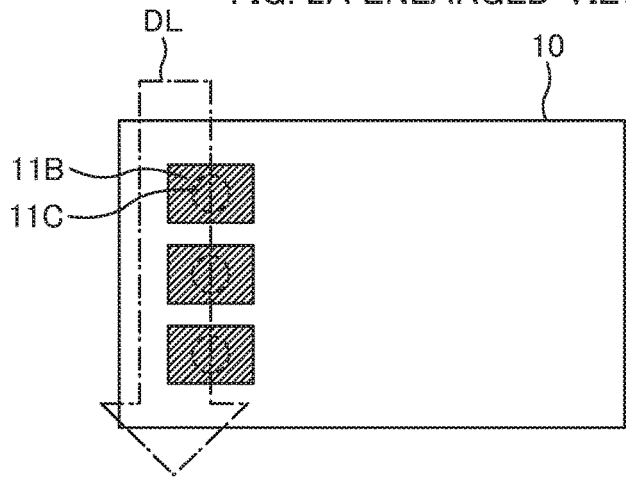
FIG. 2B END VIEW ALONG LINE D-D
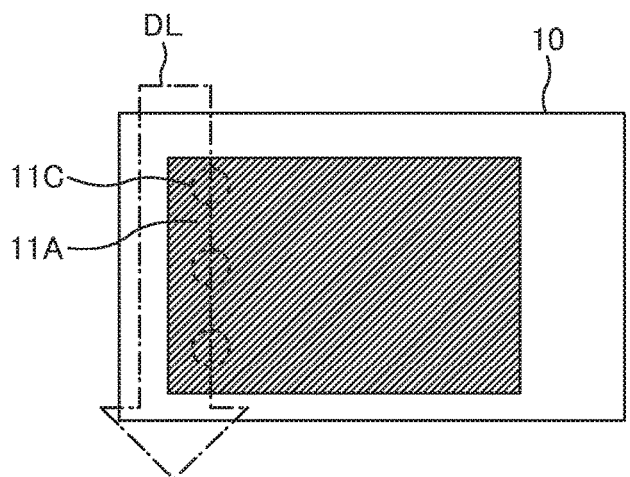
FIG. 2C END VIEW ALONG LINE E-E

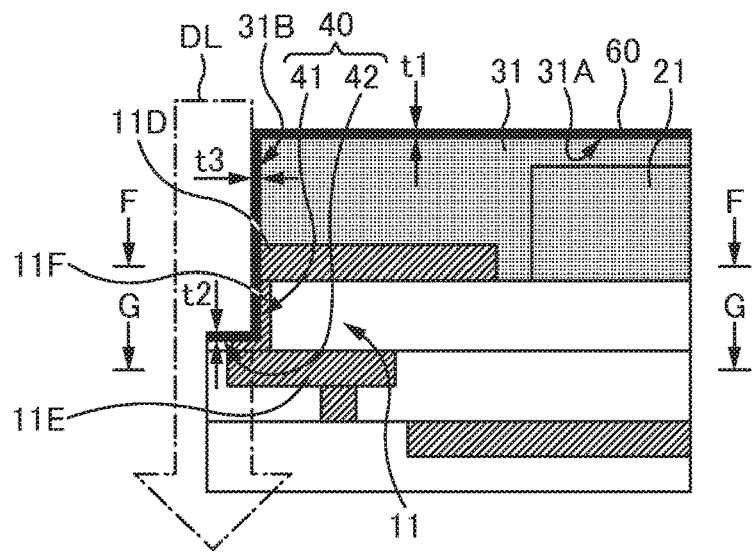
FIG. 3A ENLARGED VIEW OF REGION S
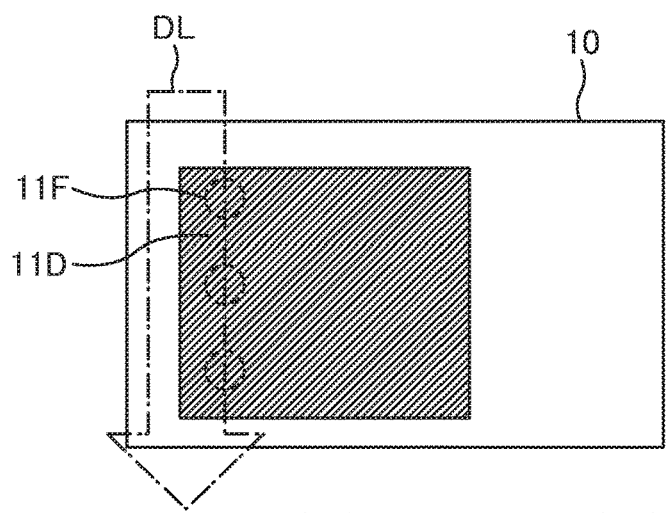
FIG. 3B END VIEW ALONG LINE F-F
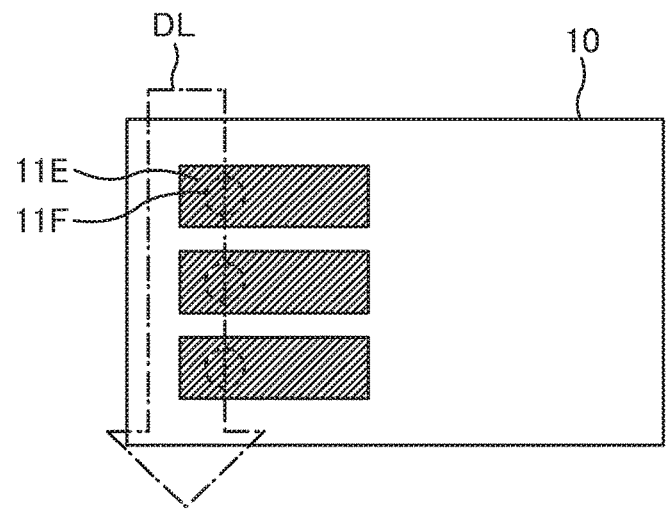
FIG. 3C END VIEW ALONG LINE G-G

METHOD OF MANUFACTURING ELECTRONIC COMPONENT MODULE

CROSS-REFERENCE TO RELATED APPLICATION

This application claims the benefit of priority to Japanese Patent Application No. 2017-67031, filed Mar. 30, 2017, of which full contents are incorporated herein by reference.

BACKGROUND OF THE INVENTION

Technical Field

The present disclosure relates to a method of manufacturing an electronic component module.

Background Art

A semiconductor package is known in which an electromagnetic shield is formed on a surface thereof so as to suppress Electro Magnetic Interference (EMI) generated from a semiconductor device. In manufacturing this type of semiconductor devices, for example, a plurality of semiconductor packages obtained by singulation from an assembly substrate is arranged and fixed at predetermined intervals on a carrier, and then a shielding film is formed by a film forming means such as sputtering.

However, it takes time and efforts to arrange and fix such singulated semiconductor packages on the carrier. In addition, since the semiconductor packages are arranged at predetermined intervals on the carrier, productivity is reduced. Furthermore, depending on film forming means, a film forming material goes around to the back surface of the semiconductor package, which causes deterioration in quality. Further, when singulation is performed by a dicing apparatus, the area of a ground electrode exposed on the side surface of a substrate is limited, which results in increase in contact resistance.

Accordingly, an aspect of the present disclosure is to provide a method of manufacturing an electronic component module capable of forming a shielding film in a state of an assembly substrate.

SUMMARY OF THE INVENTION

A method of an electronic component module according to an embodiment of the present disclosure comprises: preparing a substrate including a plurality of rectangular mounting regions each having a first side and a second side opposed to each other, the mounting regions each including a wireless region, where an electronic component is disposed, the wireless region provided closer to the first side, and an antenna region, where an antenna is disposed, the antenna region being adjacent to the wireless region on a side of the second side, a dicing region provided between the mounting regions adjacent to each other, and a sealing portion covering a surface of the mounting regions with an insulating material; forming a groove in the dicing region so as to expose a conductive pattern material on a side surface, closer to the first side, of the substrate; when forming a first sealing portion enclosing the wireless region and a second sealing portion enclosing the antenna region, reducing a thickness such that a thickness in a height direction of the second sealing portion becomes smaller than a thickness in a height direction of the first sealing portion; forming a shielding film such that a scattered matter made of a conductive material is allowed to pass through an upper surface of the second sealing portion, to be deposited onto the conductive pattern material exposed on a side surface of the substrate; and separating the substrate into the mounting regions individually.

BRIEF DESCRIPTION OF THE DRAWINGS

FIG. 2A is an enlarged view illustrating an example of a conductive pattern material in a region S of an electronic component module according to an embodiment of the present disclosure.

FIG. 2B is an enlarged view illustrating an example of a conductive pattern material in a region S of an electronic component module according to an embodiment of the present disclosure.

FIG. 2C is an enlarged view illustrating an example of a conductive pattern material in a region S of an electronic component module according to an embodiment of the present disclosure.

FIG. 3A is an enlarged view illustrating another example of a conductive pattern material in a region S of an electronic component module according to an embodiment of the present disclosure.

FIG. 3B is an enlarged view illustrating another example of a conductive pattern material in a region S of an electronic component module according to an embodiment of the present disclosure.

FIG. 3C is an enlarged view illustrating another example of a conductive pattern material in a region S of an electronic component module according to an embodiment of the present disclosure.

DETAILED DESCRIPTION

Figure 1A:
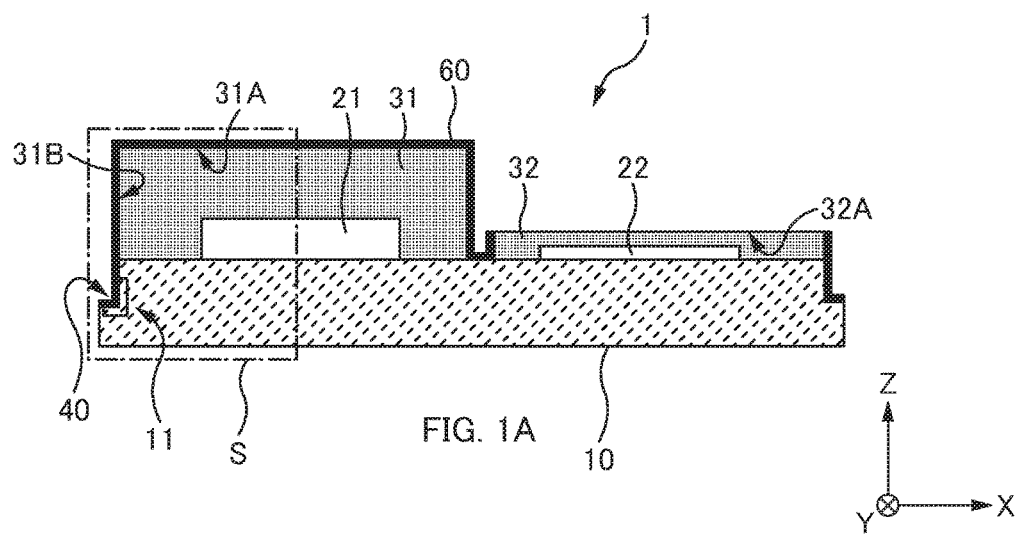
FIG. 1A is a schematic diagram illustrating an electronic component module according to an embodiment of the present disclosure.

Hereinafter, various embodiments of the present disclosure will be described with reference to drawings as appropriate. In the drawings, common or similar components are given the same or similar reference numerals.

A description will be given, hereinafter, using the following coordinate axes for convenience sake. That is, the positive direction of a Z-axis is set to be a vertically upward direction. The positive direction of a Y-axis is set to be orthogonal to the Z-axis as well as a direction from the front to the rear in the drawings. The X-axis is set to be a direction orthogonal to the Y-axis and Z-axis. Thus, the upper side and the lower side mean the positive side and the negative side of the Z-axis, respectively, while the right side and the left side mean the positive side and the negative side of the X-axis, respectively.

==Configuration of Electronic Component Module 1==

A configuration of an electronic component module 1 according to an embodiment of the present disclosure will be described with reference to FIGS. 1 to 3. FIG. 1 is a schematic diagram illustrating an electronic component module 1 according to an embodiment of the present disclosure. FIGS. 2A to 2C are enlarged views illustrating an example of a conductive pattern material 11 in a region S of the electronic component module 1. FIGS. 3A to 3C are enlarged views illustrating another example of the conductive pattern material 11 in the region S of the electronic component module 1.

Figure 1B:
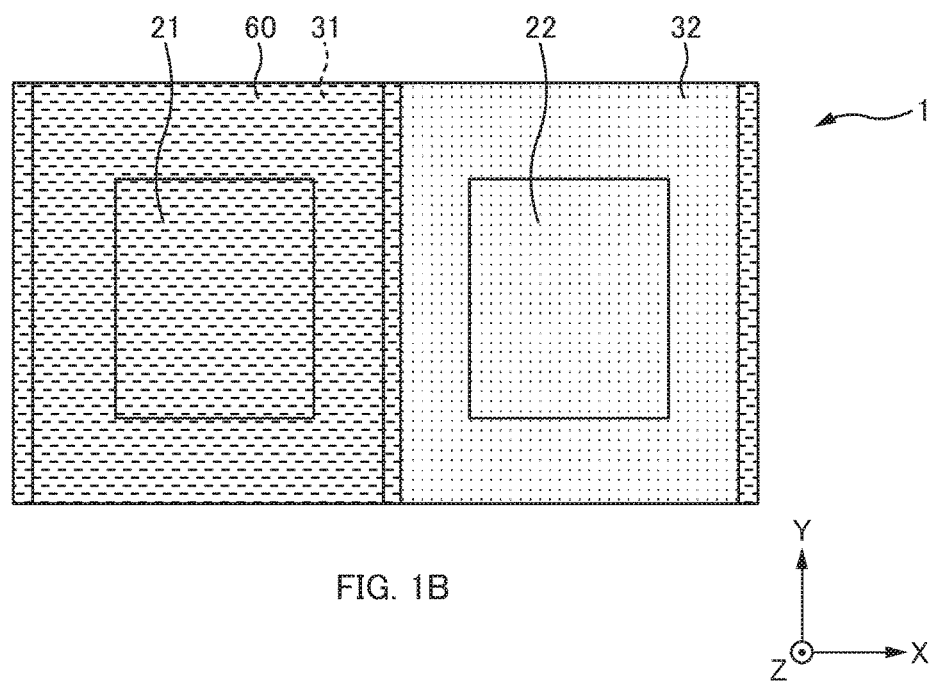
FIG. 1B is a schematic diagram illustrating an electronic component module according to an embodiment of the present disclosure.

The electronic component module 1 includes, as illustrated in FIGS. 1A and 1B, a substrate 10, the conductive pattern material 11, an electronic component 21, an antenna 22, a first sealing portion 31, a second sealing portion 32, a contact portion 40, and a shielding film 60.

The substrate 10 is a rectangular member made of an insulating material, such as resin, silicon, alumina, glass, ceramics, or a composite material, and includes the conductive pattern material 11 formed inside or in a surface thereof. The conductive pattern material 11 is, for example, an electrode, and wiring configured to be electrically connected with the electrode. The electrode is used for connection with an electronic component, and is a pad for solder connection, a bonding pad for thin metal wire, a pad on via located at the upper/lower end of a via or a through hole, or the like. In addition, the electrode may be wiring, a via configured to electrically connect wiring formed in different layers, a through hole provided to an upper layer or a lower layer with respect to an electrode, or the like. The conductive pattern material 11 is formed in a region (including a wireless region B which will be described later) where the electronic component 21 is disposed. That is, the conductive pattern material 11 is formed in a region that is to be covered with the shielding film 60, in the substrate 10. Here, mainly several types of configurations will be presented for the substrate 10 made of resin. In a first configuration, an insulation layer and the conductive pattern material 11 are laminated on both sides of a core layer. In a second configuration, a core layer is not included, and an insulation layer and the conductive pattern material 11 are laminated from the lower side to the upper side in a repeated manner. In both cases, the conductive pattern material 11 is subjected to an insulating process using an insulation layer.

<<Conductive Pattern Material 11>>

An arrangement example of the conductive pattern material 11 is illustrated in FIGS. 2A to 2C. The conductive pattern material 11 includes, as illustrated in FIG. 2C, at least one of a solid ground (the solid ground indicates here that, for example, all, substantially all, or a half of a surface of a layer in a printed-circuit board is covered with GND metal. This can strengthen and solidify ground (GND)). 11A formed in an inner layer of the substrate 10, an electrode 11B formed in a surface of the substrate 10, or a via (or a through hole) 11C. Hereinafter, it is assumed that the via 11C includes a through hole.

As illustrated in FIGS. 2B and 2C, the solid ground 11A, the electrode 11B, and the via 11C, described above, are disposed so as to overlap with a dicing line DL when viewed from the upper surface side. Accordingly, the solid ground 11A, the electrode 11B, and the via 11C result in being exposed on a side surface of the electronic component module 1 when the side surface is formed by dicing. However, it is not necessary for all of the solid ground 11A, the electrode 11B, and the via 11C to be exposed on the side surface of the electronic component module 1. For example, as illustrated in FIG. 2A, the electrode 11B and the via 11C may be exposed on the side surface of the electronic component module 1. Further, the via 11C and the solid ground 11A in the lower layer may be exposed on the side surface of the substrate 10.

Here, the dicing line DL is a virtual cutting line to perform singulation by a cutting apparatus such as a dicing apparatus. This dicing line DL is illustrated with a predetermined width in FIGS. 2A to 2C, since a blade of the cutting apparatus has a width. Thus, hereinafter, the dicing line DL may be referred to as a dicing region.

In FIGS. 2B and 2C, such vias 11C are arranged in a row along the dicing line DL. However, the vias 11C may be provided so as to form a plurality of rows. Further, the vias 11C are not necessarily aligned regularly, but may be arranged irregularly in the vicinity of the dicing line DL. By virtue of this irregular arrangement, even if a blade is displaced to a certain extent, any of the vias 11C can be exposed by grinding (dicing).

By causing the via(s) 11C to overlap with the dicing line DL as such, it is possible to secure the large area of the conductive pattern material 11 (a portion constituting the contact portion 40, such as the solid ground 11A, the electrode 11B, the via 11C, and/or the like) exposed on the side surface of the electronic component module 1. Thus, the contact area between the conductive pattern material 11 such as the via(s) 11C and the shielding film 60 which will be described later is increased. Accordingly, since the shielding film 60 is formed onto a conductive portion such as the via(s) 11C, contact resistance of the shielding film 60 in the contact portion 40, which will be described later, can be reduced. It should be noted that, preferably, the via 11C has a via hole filled with a conductive material.

Another arrangement example of the conductive pattern material 11 will be illustrated in FIGS. 3A to 3C. The conductive pattern material 11 includes, as illustrated in FIG. 3A, a solid ground 11D formed on a surface of the substrate 10, an electrode 11E formed in the substrate 10, and a via (or a through hole) 11F. In this case as well, as illustrated in FIGS. 3B and 3C, the solid ground 11D, the electrode 11E, and the via 11F are disposed so as to overlap with the dicing line DL when viewed from the upper surface side. Accordingly, the solid ground 11D and the via(s) 11E result in being exposed on the side surface of the electronic component module 1, when the side surface is formed by dicing. It should be noted that the solid ground 11D is formed broadly from one side to the other side of the substrate 10, as illustrated in FIG. 3B, thereby being able to secure a broad exposed area.

Figure 4A:
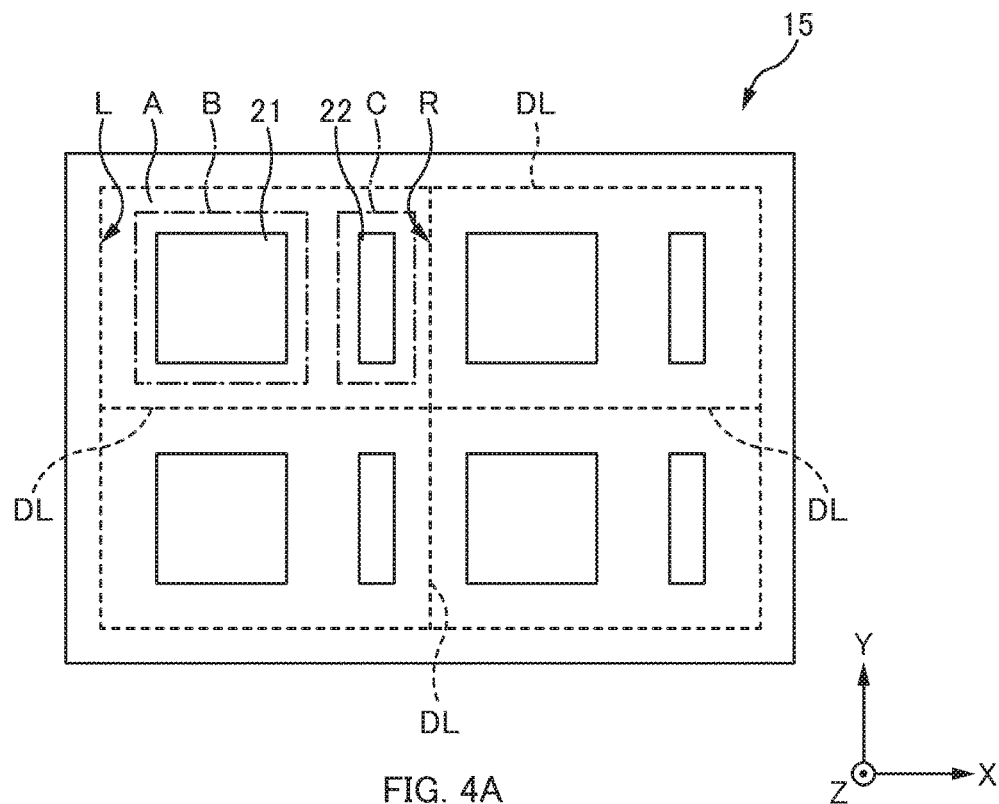
FIG. 4A is a schematic diagram illustrating a process of disposing an electronic component and an antenna to an assembly substrate, in a process of manufacturing an electronic component module according to an embodiment of the present disclosure.
Figure 4B:
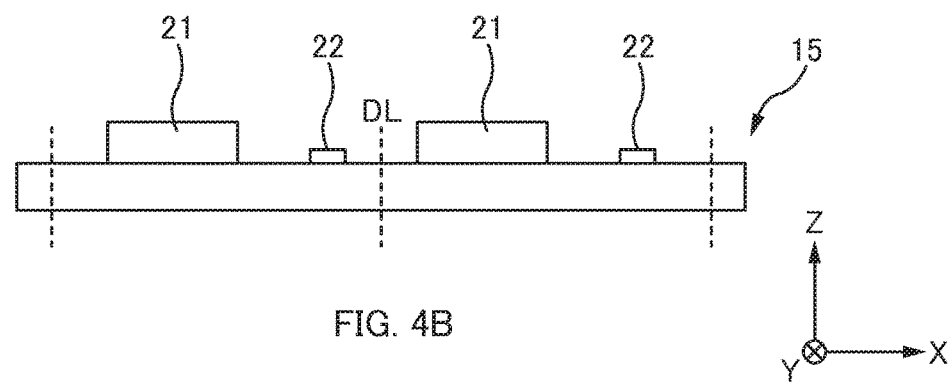
FIG. 4B is a schematic diagram illustrating a process of disposing an electronic component and an antenna to an assembly substrate, in a process of manufacturing an electronic component module according to an embodiment of the present disclosure.

Next, the electronic component 21 will be described. The electronic component 21 is provided on the upper surface side of a wireless region B of the substrate 10, as illustrated in FIGS. 4A and 4B. Here, the electronic component 21 may include a passive element such as a resistor, an inductor, and/or a capacitor, in addition to a semiconductor chip. Further, the electronic component 21 also includes a filter or the like.

The antenna 22 is disposed to be adjacent to the electronic component 21. The antenna 22 is formed as a wiring pattern in an inner layer or on the upper surface side of the substrate 10 in an antenna region C positioned adjacent to the wireless region B, as illustrated in FIGS. 4A and 4B. Further, the antenna 22 may be provided on the back side of the substrate 10.

The first sealing portion 31 is a protective member to cover the electronic component 21 and the wireless region B in the substrate 10. Further, the second sealing portion 32 is a protective member to cover the antenna 22 and the antenna region C in the substrate 10. The first and second sealing portions 31, 32 are formed using thermosetting resin for molding, such as epoxy resin or cyanate resin. Further, the first and second sealing portions 31, 32 may be formed such that thermosetting resin is cured by transfer molding, or sealing resin is provided by a potting method or a printing method using mesh screen. Furthermore, in a case where an antenna is made of a conductive pattern material, it is possible to omit the second sealing portion 32 without particularly covering with a sealing resin.

As illustrated in FIG. 2A, the contact portion 40 is constituted by the conductive pattern material 11 exposed by dicing, and includes a vertical surface 41 and a horizontal surface 42. The contact portion 40 is configured to be electrically connected to a GND through the solid ground 11A and/or the electrode 11E, for example.

The contact portion 40 may include at least one of the solid ground 11A, the electrode 11B, the via 11C, or a through hole. That is, for example, as illustrated in FIGS. 2B and 2C, in a case where the dicing line DL is formed so as to overlap with the solid ground 11A, the electrode 11B, the via 11C, or a through hole, the contact portion 40 is formed in a side surface and a bottom surface exposed by grinding. It should be noted that the contact portion 40 is configured to be electrically connected with an external GND via the solid ground 11A, the electrode 11B, the via 11C, or a through hole.

The solid ground 11A, the electrode 11B, the via 11C, or a through hole formed at such a position results in being exposed by dicing, as described above. Accordingly, the contact portion 40 includes: the vertical surface 41 (a surface parallel to YZ plane) continuous with a side surface 31B of the first sealing portion 31; and the horizontal surface 42 (a surface parallel to XY plane) continuous with the vertical surface 41. A curved surface may lie between the vertical surface 41 and the horizontal surface 42. The degree of a curve in this curved surface varies with the degree of sharpness (wear-out) of a blade of the cutting apparatus to be used.

It should be noted that the horizontal surface 42 of the contact portion 40 protrudes from the side surface of the substrate 10 flush with the side surface 31B of the first sealing portion 31, to form a step. This step can suppress the shielding film 60 from peeling off due to a direct impact onto the shielding film 60, as well as increase the strength of a package.

Further, when seeing the right side in FIG. 1A, for example, an insulation layer of the substrate 10 is formed so as to protrude from a side surface opposite to a side surface including the contact portion 40 in the substrate 10. Such a step can further increase the strength of a package. Here, as illustrated in FIG. 1A, the second sealing portion 32 covering an antenna is formed to be thinner than the first sealing portion 31, and thus warpage tends to occur between the left and right of the substrate, and/or the front and the back in the drawing. However, since a step is formed such that the shielding film 60 is formed in an L-shape, this warpage can be suppressed.

As can be applied in all the following embodiments, a portion corresponding to the horizontal surface 42 of the contact portion 40 may be a burr produced in the bottom surface at the time of dicing. In FIGS. 2A and 3A, dicing is stopped half way in the thickness direction of the substrate 10 such that the via 11C and the electrode are exposed on the horizontal surface 42. It should be noted that, in a case where swarf, so-called burr, of the via 11C or the electrode positioned on the lower side remains on the horizontal surface 42 integrally with the electrode even after shaving (grinding) has been completely finished, the shielding film 60 may be deposited on this burr. Further, cutting on the dicing line DL may be performed by laser processing. Such cutting may be performed also by waterjet process, and this implements formation of a groove.

Vapor deposition, sputtering, or CVD, performed under vacuum, is used as a film forming method of forming the shielding film 60. These film forming method commonly have such a feature that a thick film is formed on the horizontal surface 42, while a thinner film is formed on the vertical surface 41 as compared with on the horizontal surface 42. Further, on the vertical surface 41, a film is formed thinner as it goes vertically downward (to the −Z-direction side).

In view of such features of the film forming method, due to the contact portion 40, a relatively thick film is formed on the electrode 11B, a burr, or the like by exposing this electrode 11B or the like on the horizontal surface 42, while a relatively thin film is formed by exposing the electrode 11B and/or the via 11C (or a through hole) on the vertical surface 41 (and a curved surface), thereby being able to increase the contact area. This can reduce contact resistance between the contact portion 40 and the shielding film 60, thereby being able to enhance effects of suppressing EMI by virtue of the shielding film 60.

The shielding film 60 is a conductive film that covers an upper surface 31A and the side surface 31B of the first sealing portion 31 and the contact portion 40. The shielding film 60 is configured to be electrically connected with the contact portion 40, and suppress an electromagnetic wave generated in the electronic component 21 (inside the first sealing portion 31) from leaking to the outside, for example. Further, it is possible to prevent entry of noise (or the aforementioned electromagnetic wave) from the outside. It should be noted that the shielding film 60 is not formed on an upper surface 32A of the second sealing portion 32, so that a wiring pattern formed in the antenna region C acts as the antenna 22.

The shielding film 60 is made of a conductive metal material, such as Cu, Ni, Ti, Au, Ag, Pd, Pt, Fe, Cr, or SUS (stainless steel). Further, the shielding film 60 may be an alloy using plural materials of the aforementioned metal materials, or a laminated film using plural materials of the aforementioned metal materials. It should be noted that, in general, at least one each of a SUS film and a film including Cu as a main material is laminated to form a film by sputtering.

Here, it is preferable that thicknesses of the shielding film 60 in various parts are in the following relationship. That is, it is preferable that a relationship of $t1>t3$ as well as a relationship of $t2>t3$ are satisfied, where $t1$ is a film thickness of the shielding film 60 on the upper surface 31A of the first sealing portion 31, $t2$ is a film thickness of the shielding film 60 on the horizontal surface 42 of the contact portion 40, $t3$ is a film thickness of the shielding film 60 on the side surface 31B of the first sealing portion 31. When the shielding film 60 has at least such thicknesses, it is possible to form the shielding film 60 exhibiting such contact resistance as to suppress an electromagnetic wave from leaking to the outside of the first sealing portion 31.

==Method of Manufacturing Electronic Component Module 1==

Figure 5A:
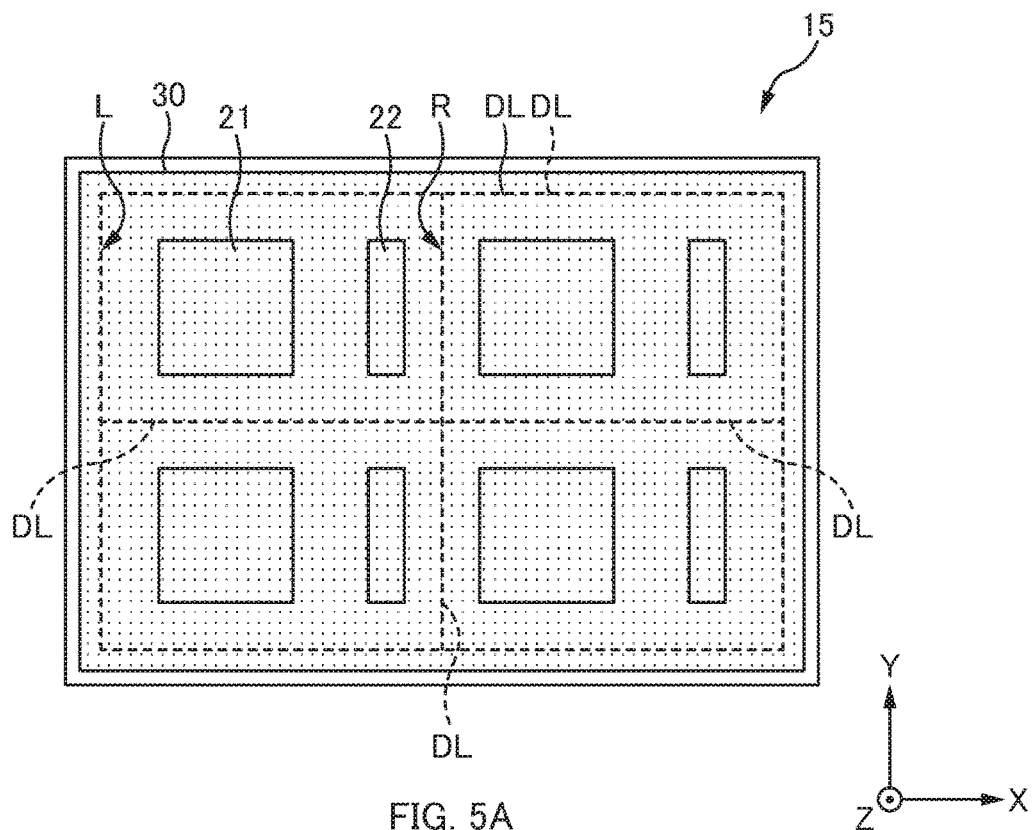
FIG. 5A is a schematic diagram illustrating a process of sealing an assembly substrate, an electronic component and an antenna, with an insulating material, in a process of manufacturing an electronic component module according to an embodiment of the present disclosure.
Figure 5B:
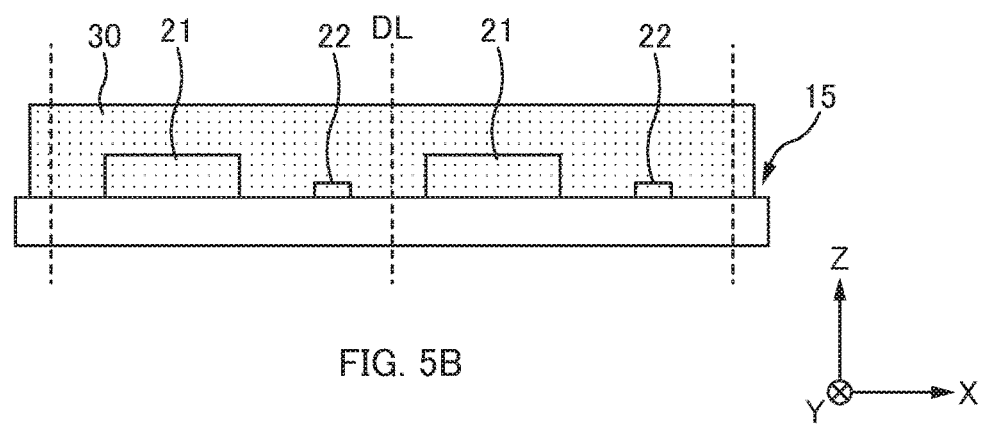
FIG. 5B is a schematic diagram illustrating a process of sealing an assembly substrate, an electronic component and an antenna, with an insulating material, in a process of manufacturing an electronic component module according to an embodiment of the present disclosure.
Figure 6A:
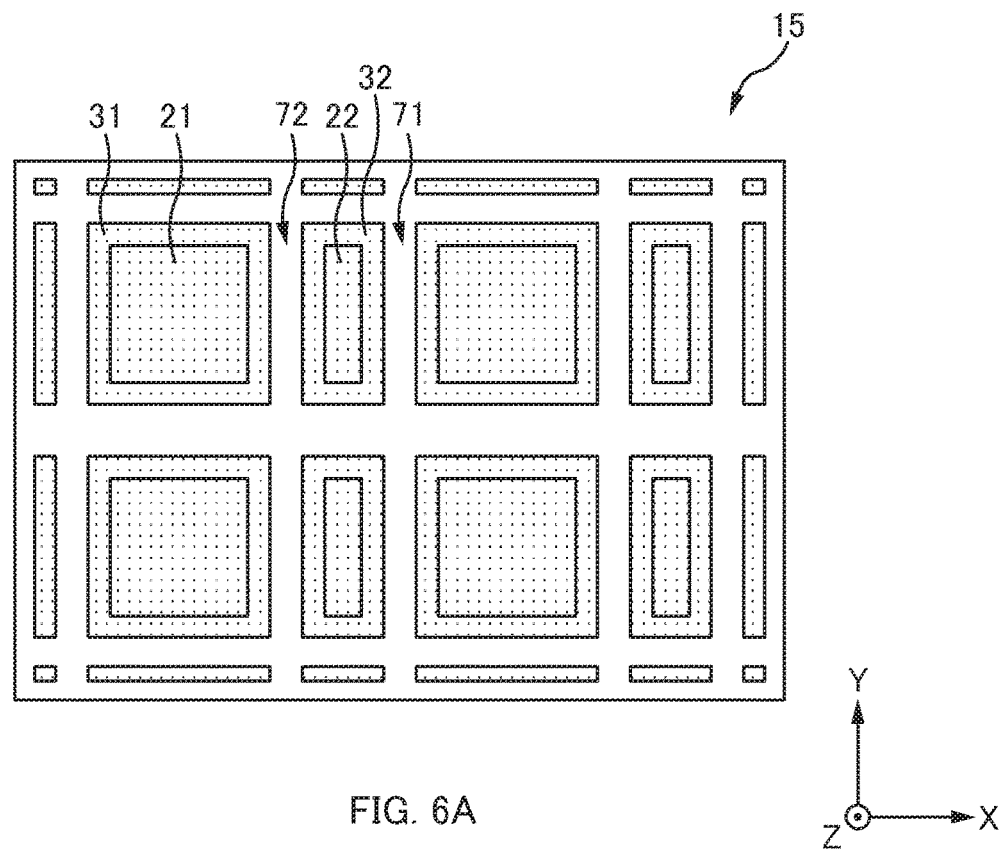
FIG. 6A is a schematic diagram illustrating a process of forming a first sealing portion and a second sealing portion by grinding, in a process of manufacturing an electronic component module according to an embodiment of the present disclosure.
Figure 6B:
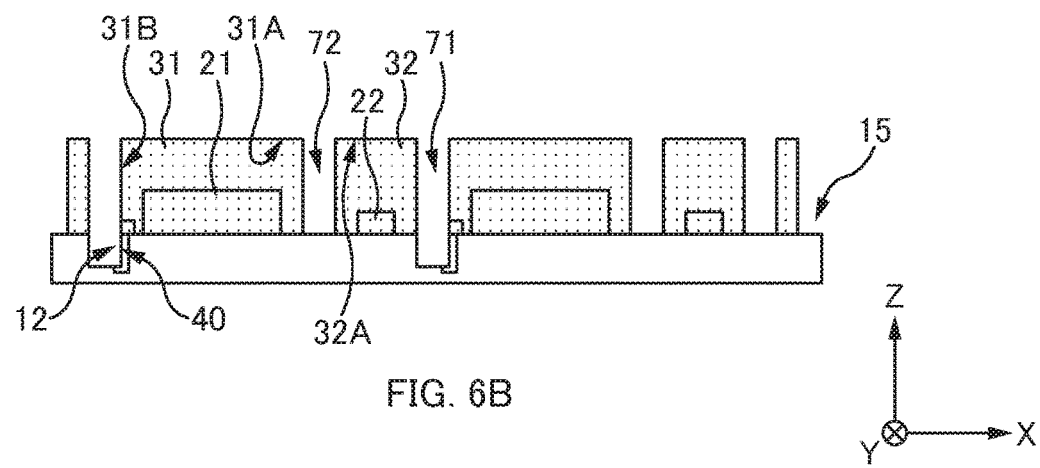
FIG. 6B is a schematic diagram illustrating a process of forming a first sealing portion and a second sealing portion by grinding, in a process of manufacturing an electronic component module according to an embodiment of the present disclosure.
Figure 7A:
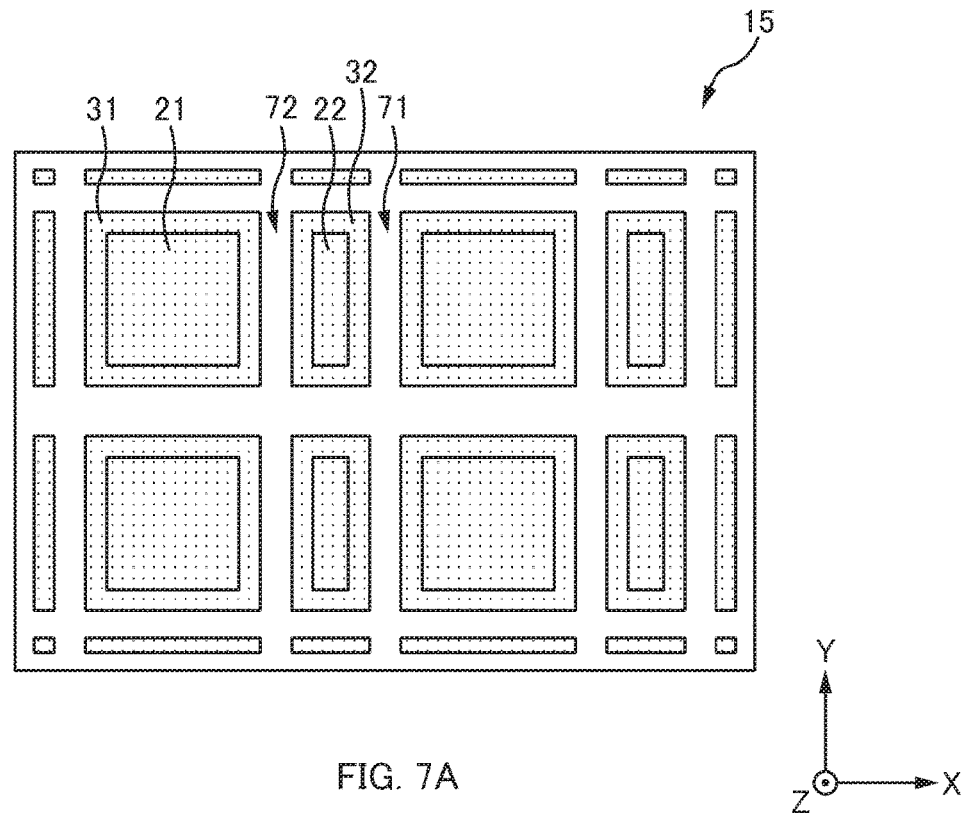
FIG. 7A is a schematic diagram illustrating a process of grinding an upper surface of a second sealing portion, in a process of manufacturing an electronic component module according to an embodiment of the present disclosure.
Figure 7B:
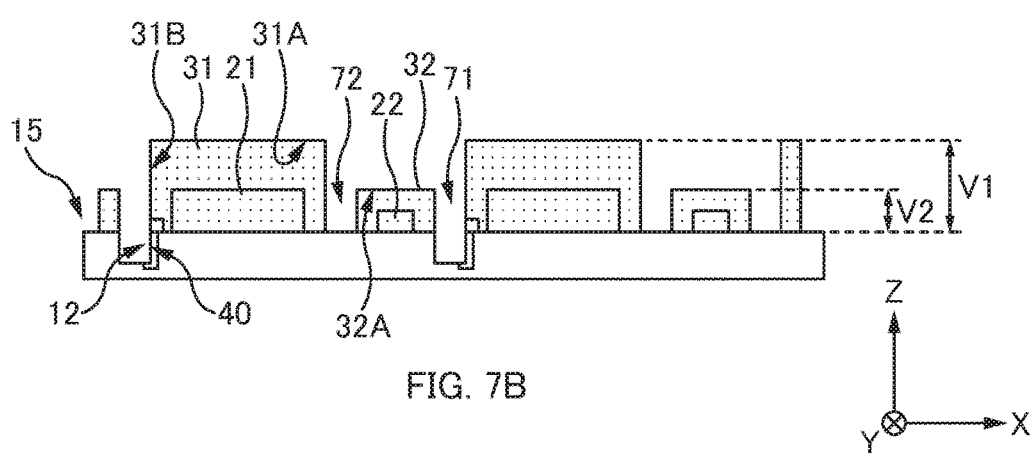
FIG. 7B is a schematic diagram illustrating a process of grinding an upper surface of a second sealing portion, in a process of manufacturing an electronic component module according to an embodiment of the present disclosure.
Figure 8A:
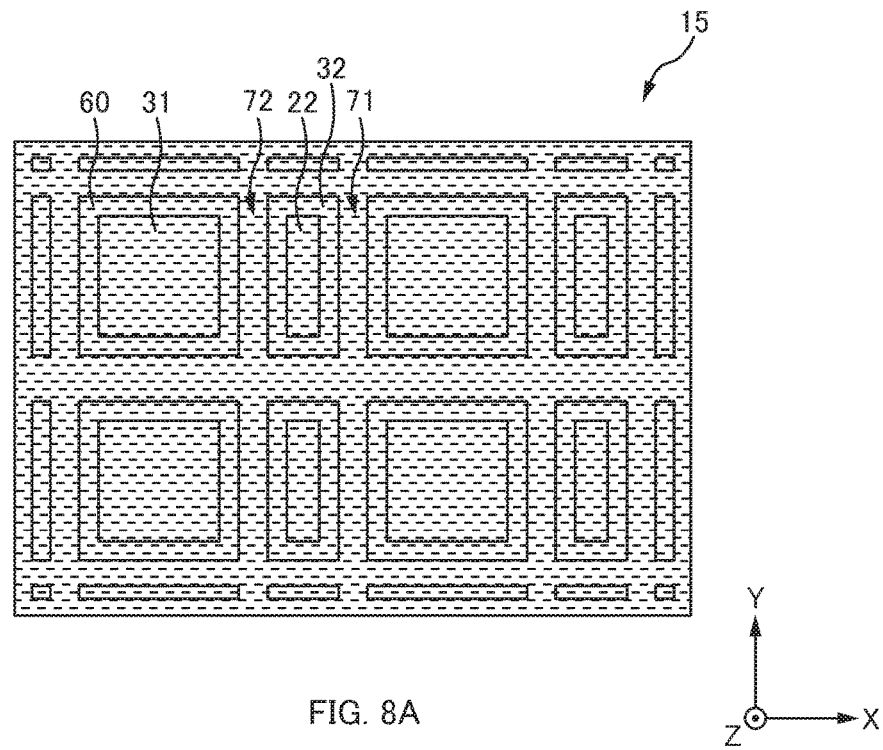
FIG. 8A is a schematic diagram illustrating a process of depositing a conductive material onto a surface of a first sealing portion and a second sealing portion, in a process of manufacturing an electronic component module according to an embodiment of the present disclosure.
Figure 8B:
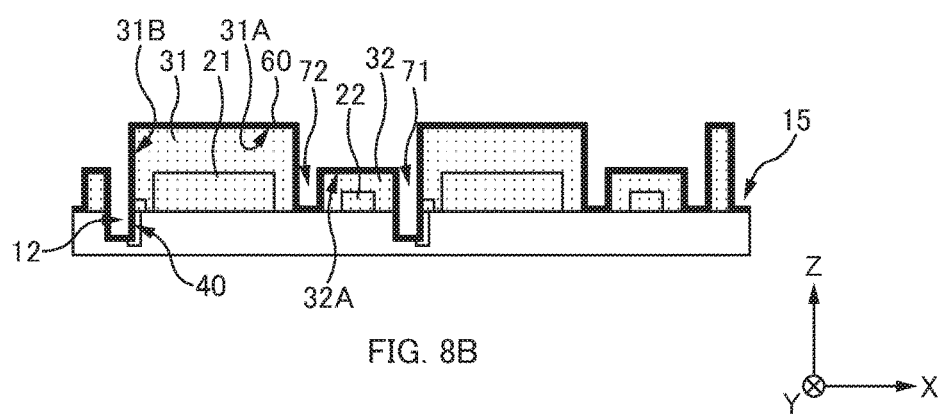
FIG. 8B is a schematic diagram illustrating a process of depositing a conductive material onto a surface of a first sealing portion and a second sealing portion, in a process of manufacturing an electronic component module according to an embodiment of the present disclosure.
Figure 9A:
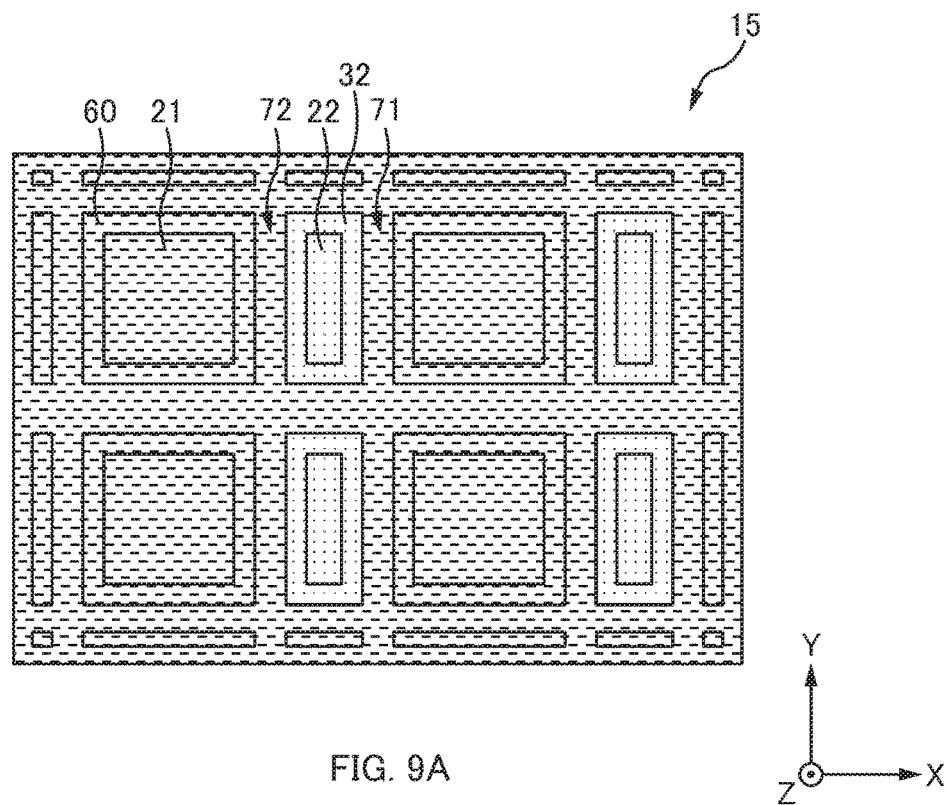
FIG. 9A is a schematic diagram illustrating a process of exposing a second sealing portion by removing a conductive material deposited onto an upper surface of a second sealing portion, in a process of manufacturing an electronic component module according to an embodiment of the present disclosure.
Figure 9B:
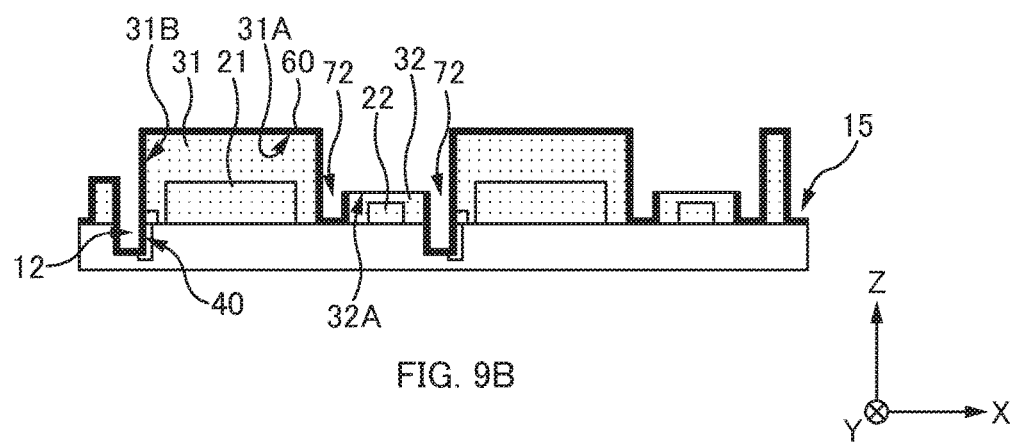
FIG. 9B is a schematic diagram illustrating a process of exposing a second sealing portion by removing a conductive material deposited onto an upper surface of a second sealing portion, in a process of manufacturing an electronic component module according to an embodiment of the present disclosure.
Figure 10A:
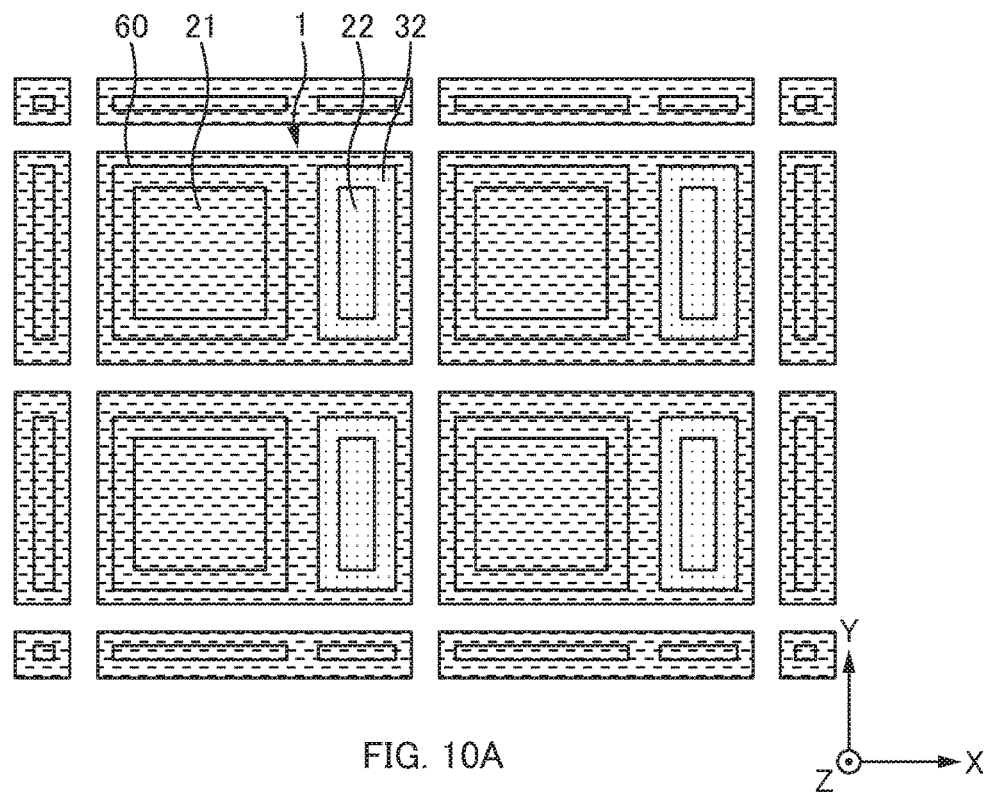
FIG. 10A is a schematic diagram illustrating a process of singulating electronic component modules, in a process of manufacturing an electronic component module according to an embodiment of the present disclosure.
Figure 10B:
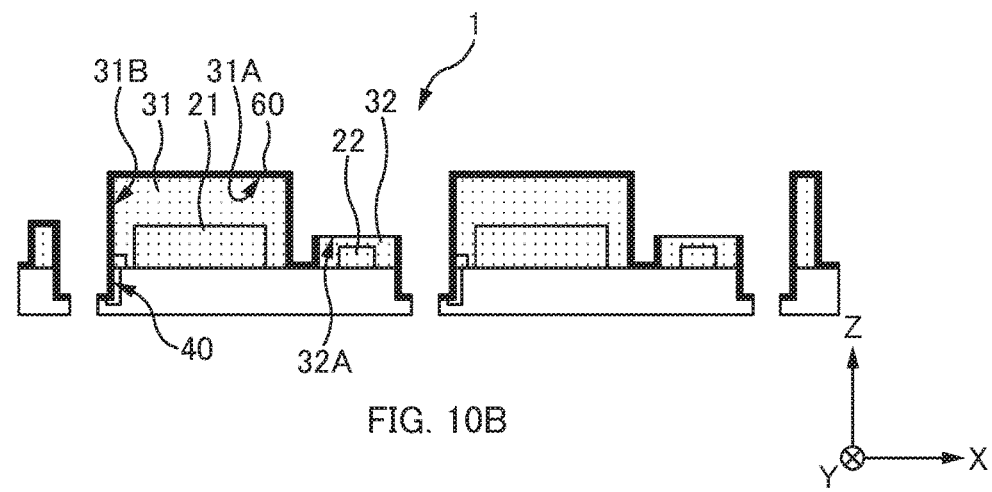
FIG. 10B is a schematic diagram illustrating a process of singulating electronic component modules, in a process of manufacturing an electronic component module according to an embodiment of the present disclosure.
Figure 11:
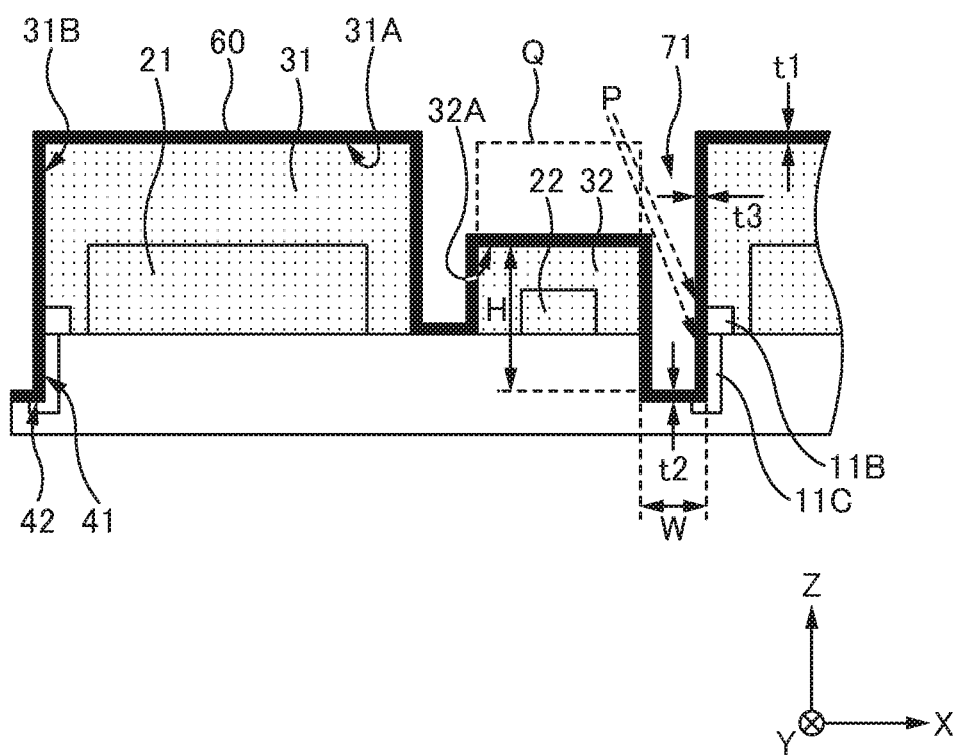
FIG. 11 is a diagram illustrating, in detail, a process of depositing a conductive material onto a surface of a first sealing portion and a second sealing portion of FIG. 8B.

A method of manufacturing the electronic component module 1 including the above described configuration will be described with reference to FIGS. 4A to 11. FIGS. 4A to 11 are diagrams illustrating the process of manufacturing the electronic component module 1. In specific, FIGS. 4A and 4B illustrate a process of disposing the electronic component 21 and the antenna 22 to an assembly substrate 15. FIGS. 5A and 5B illustrate a process of sealing the assembly substrate 15, the electronic component 21, and the antenna 22, with an insulating material. FIGS. 6A and 6B illustrate a process of forming the first sealing portion 31 and the second sealing portion 32 by grinding. FIGS. 7A and 7B illustrate a process of grinding the upper surface 32A of the second sealing portion 32. FIGS. 8A and 8B illustrate a process of depositing a conductive material onto a surface of the first sealing portion 31 and the second sealing portion 32. FIGS. 9A and 9B illustrate a process of exposing the second sealing portion 32 by removing a conductive material deposited onto the upper surface 32A of the second sealing portion 32. FIGS. 10A and 10B illustrate a process of singulating the electronic component modules 1. In FIGS. 4A to 10B, the configurations of the electronic component module 1 are simplified, for convenience sake. Further, FIG. 11 illustrates, in detail, a process of depositing a conductive material onto a surface of the first sealing portion 31 and the second sealing portion 32 of FIG. 8B.

First, as illustrated in FIGS. 4A and 4B, the assembly substrate 15 including the conductive pattern material 11 is prepared. In the assembly substrate 15, a plurality of mounting regions A is provided vertically and horizontally (in the X-axis direction and Y-axis direction). Each of the mounting regions A is rectangular shaped, and is formed including a first provisional side L and a second provisional side R opposed to each other.

In each of the mounting regions A, the wireless region B and the antenna region C are formed. The wireless region B is provided on the first provisional side L side (closer to the first provisional side L), and the electronic component 21 is disposed within this region. Further, the antenna region C is provided to be adjacent to the +X-side of the wireless region (to be adjacent to the wireless region B on the side of the second provisional side R), and a wiring pattern serving as the antenna 22 is disposed therein. It should be noted that the antenna 22 is provided on the front or back side or an inner layer of the substrate 10.

Further, in the assembly substrate 15, a dicing line (dicing region) DL is provided between the plurality of mounting regions A adjacent to each other.

Next, as illustrated in FIGS. 5A and 5B, the assembly substrate 15 including a sealing portion 30 is formed such that surfaces of the mounting regions A is covered with an insulating material.

Then, as illustrated in FIGS. 6A and 6B, a groove 71 is formed by grinding the dicing region DL using a grinding apparatus with a blade having a predetermined width, such as a dicing apparatus. At this time, grinding is performed such that the contact portion 40 (the solid ground 11A, the electrode 11B, the via 11C, etc.) is formed on a side surface 12 of the assembly substrate 15 on the first provisional side L side. It should be noted that a cutting process may be a process using laser.

Furthermore, a groove 72 is formed by performing grinding between the wireless region B and the antenna region C, to form the first sealing portion 31 enclosing the wireless region B and the second sealing portion 32 enclosing the antenna region C. At this time, the groove 72 has such a depth (a length in the Z-axis direction), for example, as to expose a surface of the assembly substrate 15, or not to reach the conductive pattern material 11 on the surface.

Concurrently with or after the formation of the groove 72, as illustrated in FIGS. 7A and 7B, the upper surface 32A of the second sealing portion 32 is ground such that a thickness V2 in a height direction of the second sealing portion 32 is made smaller than a thickness V1 in a height direction of the first sealing portion 31. In this case as well, a cutting apparatus is preferable but laser may be used. This cutting process is to facilitate deposition of scattered matters P made of a conductive material onto the conductive pattern material 11 (contact portion 40) exposed on the side surface 12 of the assembly substrate 15, in the next film forming process (see FIG. 11), by allowing the scattered matters P to pass through a space Q formed above the second sealing portion 32. Preferably, as illustrated in FIG. 11, the upper surface 32A of the second sealing portion 32 is ground such that a length (distance) H on the side surface from a bottom surface of the groove 71 to the upper surface 32A of the second sealing portion 32 becomes is not more than twice a width W of the groove 71. Accordingly, even in the case where intervals (i.e., width W of the groove 71) of packages on the assembly substrate 15 are narrow, it is possible to form the shielding film 60 having a sufficient thickness on the side surface of such a package. By virtue of this space created by the cutting process, the groove has a depth as if it were shallow, which creates the effects that scattered matters can more easily reach the contact portion 40.

Next, as illustrated in FIGS. 8A and 8B, a film is formed (deposition) using a conductive material so as to cover the first sealing portion 31 and the second sealing portion 32. The film forming process is performed by a vacuum film forming method such as vapor deposition, sputtering, or chemical vapor deposition (CVD). At this time, as illustrated in FIG. 11, the particles P of a conductive material are allowed to pass through the space Q above the second sealing portion 32, so that a sufficient film thickness of the shielding film 60 can be formed below the side surface 12 of the groove 71 (and the side surface 31B of the first sealing portion 31). Furthermore, the shielding film 60 is formed on a surface where the electrode 11B and/or the via 11C constituting the contact portion 40 is exposed, and thus contact resistance of the shielding film 60 can be reduced.

Then, as illustrated in FIGS. 9A and 9B, in the upstream process, the conductive material deposited onto the upper surface 32A of the second sealing portion 32 and the upper surface 32A are ground, to expose the second sealing portion 32. Accordingly, the wiring pattern disposed in the antenna region C acts as the antenna 22. It should be noted that only this portion may be selectively subjected to etching.

Finally, as illustrated in FIGS. 10A and 10B, the dicing region DL is further ground to separate the assembly substrate 15, so that the singulated electronic component modules 1 are produced. It is preferable that a blade of the cutting apparatus used at this time has a width smaller than a width of the groove 71 so that the shielding film 60 will not be damaged and further the aforementioned step of the contact portion 40 can be easily formed.

==Method of Forming Shielding Film 60==

Here, the reason why vapor deposition, sputtering, or CVD is used as the method of forming the shielding film 60 will be described. The method of forming a shielding film commonly includes plating, printing of conductive paste, sputtering, vapor deposition, CVD, and the like.

Plating uses a plating solution for immersion, and thus is not so preferable in terms of reliability of a package. Further, plating has also issues in facility and waste such as effluent processing. Printing of conductive paste uses a resin paste mixed with noble metal. However, such a material is expensive, and there is a tendency that electrical resistance increases since resin exists among metal particles. Furthermore, shielding performance cannot be enhanced unless the conductive paste is applied relatively thick. On the other hand, the vacuum film-forming method (vapor deposition, sputtering, or CVD) does not have the above described issues, and is excellent in reliability and uniformity in film thickness of a shielding film. Thus, in an embodiment of the present disclosure, the vacuum film-forming method is employed as the film forming method. Hereinafter, a case of employing sputtering as an example of the vacuum film-forming method will be described, however, a film can be formed similarly by vapor deposition or CVD as well.

Sputtering is advantageous in that contact resistance is low and a film thickness can be made smaller than the thickness when using conductive paste, since metal particles are deposited in a layered manner. However, it is difficult to ensure a film thickness on the side surface side of the sealing portion 30, since it is difficult for sputtered particles to enter a narrow dicing groove and also the sputtered particles tend to travel straight to some extent.

Accordingly, sputtering is commonly performed after singulation of packages. At this occasion, the film thickness of the shielding film is ensured by securing a predetermined space between individual pieces. However, this method is inferior in terms of mass productivity as compared with a method of manufacturing in a state of an assembly substrate.

In sputtering, due to the above-described directional characteristics of the particles of a film-forming material or characteristics of traveling straight thereof, if a space between the packages is narrow, the film thickness of the shielding film formed on the side surface of a package tends to become smaller than the film thickness of the shielding film formed on the upper surface of the package.

In view of such a point, in an embodiment of the present disclosure, when the groove 71 is formed by dicing, the solid ground 11A, the electrode 11B, or the via 11C is partially cut, to expose the vertical surface 41, the horizontal surface 42, and the curved surface of the contact portion 40, as described above. When the film formation is performed in this state, as illustrated in FIG. 3A, the film thickness t2 of the shielding film 60 formed on the horizontal surface 42 becomes greater than the film thickness t3 of the shielding film 60 formed on the vertical surface 41. This can increase the contact area between the shielding film 60 and the curved surface and horizontal surface 42, and increase the film thicknesses of the shielding film 60, thereby being able to reduce contact resistance.

Furthermore, the shielding film 60 is formed on the vertical surface 41 that is constituted by the solid ground 11A, the electrode 11B, or the via 11C that is exposed by cutting (see FIG. 3A). This can increase the contact area between the vertical surface 41 and the shielding film 60, thereby being able to reduce contact resistance.

As such, in embodiments of the present disclosure, it becomes possible to form the shielding film 60 in the state of the assembly substrate 15, and thus rearrangement and tape fixing of semiconductor packages when film formation is performed after singulation is unnecessary. Further, since productivity is enhanced as such, manufacturing cost can be reduced accordingly. Further, it is possible to improve quality and yields, since there is no wraparound of a film forming material to the back side of the substrate, as in the case where film formation is performed after singulation.

As has been described above, in the method of manufacturing the electronic component module 1, prepared is the assembly substrate 15 including the plurality of mounting regions A each having the first side L and the second side R opposed to each other, the mounting regions A each including the wireless region B where the electronic component 21 is disposed, the wireless region B provided closer to the first side L, and the antenna region C, where the antenna 22 is disposed, the antenna region C being adjacent to the wireless region B on the side of the second side R, the dicing region DL provided between the mounting regions A adjacent to each other, and the sealing portion 30 covering the surface of the mounting regions A with an insulating material. Then, the groove 71 is formed in the dicing region DL so as to expose the conductive pattern material 11 on the side surface, closer to the first side L, of the assembly substrate 15. Then, the thickness is reduced, such that the thickness V2 in the height direction of the second sealing portion 32 becomes smaller than the thickness V1 in the height direction of the first sealing portion 31, when forming the first sealing portion 31 enclosing the wireless region B and the second sealing portion 32 enclosing the antenna region C. Then, the shielding film 60 is formed such that the scattered matter P made of a conductive material, is allowed to pass through the upper surface 32A of the second sealing portion 32, to be deposited onto the conductive pattern material 11 exposed on the side surface 12 of the assembly substrate 15. Then, the assembly substrate 15 is separated into the mounting regions A individually, thereby manufacturing the electronic component module 1.

According to such an embodiment, it becomes possible to form the shielding film 60 in a state of the assembly substrate 15, thereby enhancing productivity, resulting in a reduction in manufacturing cost. Further, there is no wraparound of a film forming material to the back side of the substrate, as in the case where film formation is performed after singulation. This can improve quality and yields.

Further, it is preferable that the scattered matter P is produced by vapor deposition, sputtering, or CVD. According to such an embodiment, it is possible to form the shielding film 60 that is excellent in reliability and uniformity in film thickness.

Further, it is preferable that the second sealing portion 32 is formed such that a length H from a bottom surface of the groove 71 to the upper surface 32A of the second sealing portion 32 is not more than twice the width W of the groove 71. According to such an embodiment, it becomes possible to form the shielding film 60 having a sufficient film thickness on the side surface of a package, even in the case where intervals (i.e., the width W of the groove 71) between packages on the assembly substrate 15 are narrow, thereby enhancing the productivity of the electronic component module 1.

Further, it is preferable that the conductive pattern material 11 forms the contact portion 40, the contact portion 40 including the vertical surface 41 continuous with the side surface 31B of the first sealing portion 31 and the horizontal surface 42 continuous with the vertical surface. According to such an embodiment, the thickness t2 of the shielding film 60 formed on the horizontal surface 42 is made greater than the thickness t3 of the shielding film 60 formed on the vertical surface 4. Accordingly, it is possible to increase the contact area with the shielding film 60 in the horizontal surface 42 (and the curved surface), thereby contributing to reduction in contact resistance.

Although embodiments of the present disclosure have been described above, the present disclosure is not limited thereto. The foregoing materials, shapes, and arrangements of components are merely embodiments for implementing the present disclosure, and can be variously changed without departing from the gist the disclosure.

What is claimed is:

1. A method of manufacturing an electronic component module comprising:
   preparing a substrate that has:
     a plurality of identical rectangular mounting regions arranged in a matrix, each of the rectangular mounting regions having a first side and a second side opposed to each other, and a third side and a fourth side opposed to each other, each of the mounting regions including:
       a wireless region in which an electronic component is disposed, the wireless region being provided closer to the first side and having a rectangular shape extending from the third side to the fourth side, and
       an antenna region in which an antenna is disposed on an upper surface side of the substrate, in an inner layer of the substrate, or on a back side of the substrate, the antenna region being adjacent to the wireless region on a side of the second side, and having a rectangular shape extending from the third side to the fourth side;
     a dicing region provided between the mounting regions adjacent to each other, and
     a sealing portion covering an entire surface of the plurality of mounting regions including the electronic components and the antenna regions with an insulating material;
   forming a first groove from a top surface of the sealing portion in the dicing region penetrating the sealing portion vertically and reaching an intermediate depth within the substrate so as to expose an edge of a conductive pattern material embedded in the substrate on an inner side wall of the first groove at the first side of the mounting region in each of the mounting regions, the exposed edge of the conductive pattern material thereby facing a side face of the substrate that is exposed by the first groove at the second side of the adjacent mounting region;
   forming a second groove from the top surface of the sealing portion penetrating the sealing portion vertically up to a depth shallower than the first groove at a boundary line that separates the wireless region and the antenna region in each of the mounting regions, the second groove thereby extending from the third side to the fourth side in each of the mounting regions, and thereby the wireless region being surrounded by the first groove and the second groove at a side of the first side and the antenna region being surrounded by the first groove and the second groove at a side of the second side;
   reducing a thickness of the sealing portion in the antenna region by removing a top layer of the sealing portion in the antenna region so as to form a first sealing portion enclosing the wireless region and a second sealing portion that is lower in height than the first sealing portion enclosing the antenna region;
   sputtering a conductive material in a vacuum chamber on an entire surface of the substrate in which the first sealing portions and the second sealing portions have been formed so as to form a shielding film, the sputtered conductive material passing a space over the second sealing portion that is created by reducing the thickness and reaching the exposed edge of the conductive pattern material through the first groove so that the conductive material is deposited on the inner side wall of the first groove as well as on the exposed edge of the conductive pattern material in each of the mounting regions; and
   separating the substrate into the mounting regions individually.

2. The method of manufacturing an electronic component module according to claim 1, wherein the second sealing portion is formed such that a vertical length from a bottom of the first groove to an upper surface of the second sealing portion is not more than twice a width of the first groove.

3. The method of manufacturing an electronic component module according to claim 1, wherein the conductive pattern material forms a contact portion, the contact portion including a vertical surface continuous with a side surface of the first sealing portion and a horizontal surface continuous with the vertical surface.

4. The method of manufacturing an electronic component module according to claim 1, wherein the antenna is disposed on the upper surface side of the substrate and the second groove does not reach the upper surface of the substrate.

5. The method according to claim 1, further comprising removing the conductive material on the top surface of the second sealing portion so as to expose the top surface of the second sealing portion, thereby forming the shielding film exposing the top surface of the second sealing portion in each of the mounting regions.

* * * * *